US010075189B2

(12) United States Patent
Li et al.

(10) Patent No.: US 10,075,189 B2
(45) Date of Patent: Sep. 11, 2018

(54) TECHNIQUES FOR VARIABLE FORWARD ERROR CORRECTION

(71) Applicant: Altera Corporation, San Jose, CA (US)

(72) Inventors: Peng Li, Palo Alto, CA (US); Martin Langhammer, Salisbury (GB); Jon Long, Livermore, CA (US)

(73) Assignee: Altera Corporation, San Jose, CA (US)

( * ) Notice: Subject to any disclaimer, the term of this patent is extended or adjusted under 35 U.S.C. 154(b) by 292 days.

(21) Appl. No.: 14/745,870

(22) Filed: Jun. 22, 2015

(65) Prior Publication Data
US 2016/0373138 A1    Dec. 22, 2016

(51) Int. Cl.
*H03M 13/35* (2006.01)
*H04L 1/00* (2006.01)
*H04B 10/079* (2013.01)
*H04L 1/20* (2006.01)
*H03M 13/15* (2006.01)
*H03M 13/29* (2006.01)
*H03M 13/25* (2006.01)

(52) U.S. Cl.
CPC ...... *H03M 13/353* (2013.01); *H04B 10/0797* (2013.01); *H04L 1/0001* (2013.01); *H04L 1/004* (2013.01); *H04L 1/0009* (2013.01); *H03M 13/152* (2013.01); *H03M 13/255* (2013.01); *H03M 13/2906* (2013.01); *H04L 1/0026* (2013.01); *H04L 1/203* (2013.01)

(58) Field of Classification Search
CPC ............ H03M 13/255; H03M 13/152; H03M 13/2906; H04L 1/0009; H04L 1/004; H04L 1/0026; H04L 1/203
See application file for complete search history.

(56) References Cited

U.S. PATENT DOCUMENTS

| 7,251,386 B1 * | 7/2007 | Dickinson ............. B82Y 20/00 385/129 |
| 7,346,827 B2 | 3/2008 | Eroz et al. |
| 8,009,985 B1 * | 8/2011 | Roberts ..................... H04J 3/14 398/47 |

(Continued)

FOREIGN PATENT DOCUMENTS

EP    1780914    5/2007

OTHER PUBLICATIONS

European Patent Office, European Search Report and Opinion for European Patent Application EP 16 17 2801.

(Continued)

*Primary Examiner* — April Ying Shan Blair
*Assistant Examiner* — Sazzad Hossain
(74) *Attorney, Agent, or Firm* — Steven Cahill

(57) ABSTRACT

A system includes an encoding circuit, a line quality monitor circuit, and a controller circuit. The encoding circuit generates a first data signal indicating encoded data using a first forward error correction code. The line quality monitor circuit generates an indication of a line quality of a second data signal using an eye monitor circuit that monitors the second data signal. The controller circuit causes the encoding circuit to generate encoded data in the first data signal using a second forward error correction code in response to a change in the indication of the line quality of the second data signal.

20 Claims, 5 Drawing Sheets

(56) References Cited

U.S. PATENT DOCUMENTS

| | | |
|---|---|---|
| 8,111,784 B1 | 2/2012 | Ding et al. |
| 8,433,958 B2 | 4/2013 | Ding et al. |
| 8,451,883 B1 | 5/2013 | Ding et al. |
| 8,521,020 B2 * | 8/2013 | Welch ............... B82Y 20/00 398/193 |
| 8,626,474 B2 | 1/2014 | Li et al. |
| 8,649,686 B1 * | 2/2014 | Booth ............ H04B 10/0795 398/140 |
| 8,744,012 B1 | 6/2014 | Ding et al. |
| 8,837,571 B1 | 9/2014 | Ke et al. |
| 8,977,938 B2 | 3/2015 | Langhammer et al. |
| 9,002,155 B2 | 4/2015 | Li et al. |
| 2006/0008279 A1 | 1/2006 | Chiang et al. |
| 2007/0183738 A1 * | 8/2007 | Welch ............... B82Y 20/00 385/147 |
| 2009/0141560 A1 * | 6/2009 | Park ................ G06F 11/1068 365/185.22 |
| 2010/0002692 A1 * | 1/2010 | Bims ................ H04L 1/0009 370/389 |
| 2010/0247028 A1 * | 9/2010 | Nagarajan ........... H04B 10/501 385/14 |
| 2012/0240010 A1 * | 9/2012 | Wang ............... G06F 13/4286 714/763 |
| 2012/0251116 A1 | 10/2012 | Li et al. |
| 2013/0156420 A1 | 6/2013 | Amitai et al. |
| 2014/0181616 A1 * | 6/2014 | Arunarthi ........... H04B 10/272 714/755 |

OTHER PUBLICATIONS

Infinera, "Photonic Integrated Circuits A Technology and Application Primer," White paper, 2005, pp. 1-13.

* cited by examiner

TECHNIQUES FOR VARIABLE FORWARD ERROR CORRECTION

FIELD OF THE DISCLOSURE

The present invention relates to electrical and optical circuits, and more particularly, to techniques for variable forward error correction (FEC).

BACKGROUND

A photonic integrated circuit (PIC) is a device that includes one or more optical components. A PIC may be made using a variety of materials, for example, indium phosphide, gallium arsenide, lithium niobate, or silicon. A PIC performs functions on signals that are in optical wavelengths. A PIC can be used for performing communication through optical networks having optical fibers as a transmission medium.

Optical fiber is generally chosen for systems that require higher bandwidth or spanning longer distances than electrical cabling can accommodate. The benefits of optical fiber include exceptionally low loss, which allows for long distances between amplifiers and/or repeaters. Optical fiber does not have ground currents and other parasite signal and power issues common to long parallel electric conductor lines, because optical fiber uses light rather than electrical waves for transmission. Also, optical fiber has an inherently high data-carrying capacity. Thousands of electrical links would be required to replace a single high bandwidth fiber cable. Another benefit of optical fiber is that even when multiple optical fiber cables are placed alongside each other for long distances, fiber cables experience effectively no crosstalk, in contrast to some types of electrical transmission lines.

BRIEF SUMMARY

According to some embodiments, a system includes an encoding circuit, a line quality monitor circuit, and a controller circuit. The encoding circuit generates a first data signal indicating encoded data using a first forward error correction code. The line quality monitor circuit generates an indication of a line quality of a second data signal using an eye monitor circuit that monitors the second data signal. The eye monitor circuit may include, for example, an eye oscilloscope. The controller circuit causes the encoding circuit to generate encoded data in the first data signal using a second forward error correction code in response to a change in the indication of the line quality of the second data signal.

The embodiments disclosed herein can be implemented in numerous ways, such as a process, an apparatus, a system, a device, and/or a method. Various objects, features, and advantages of the embodiments will become apparent upon consideration of the following detailed description and the accompanying drawings.

DETAILED DESCRIPTION

Figure 1:
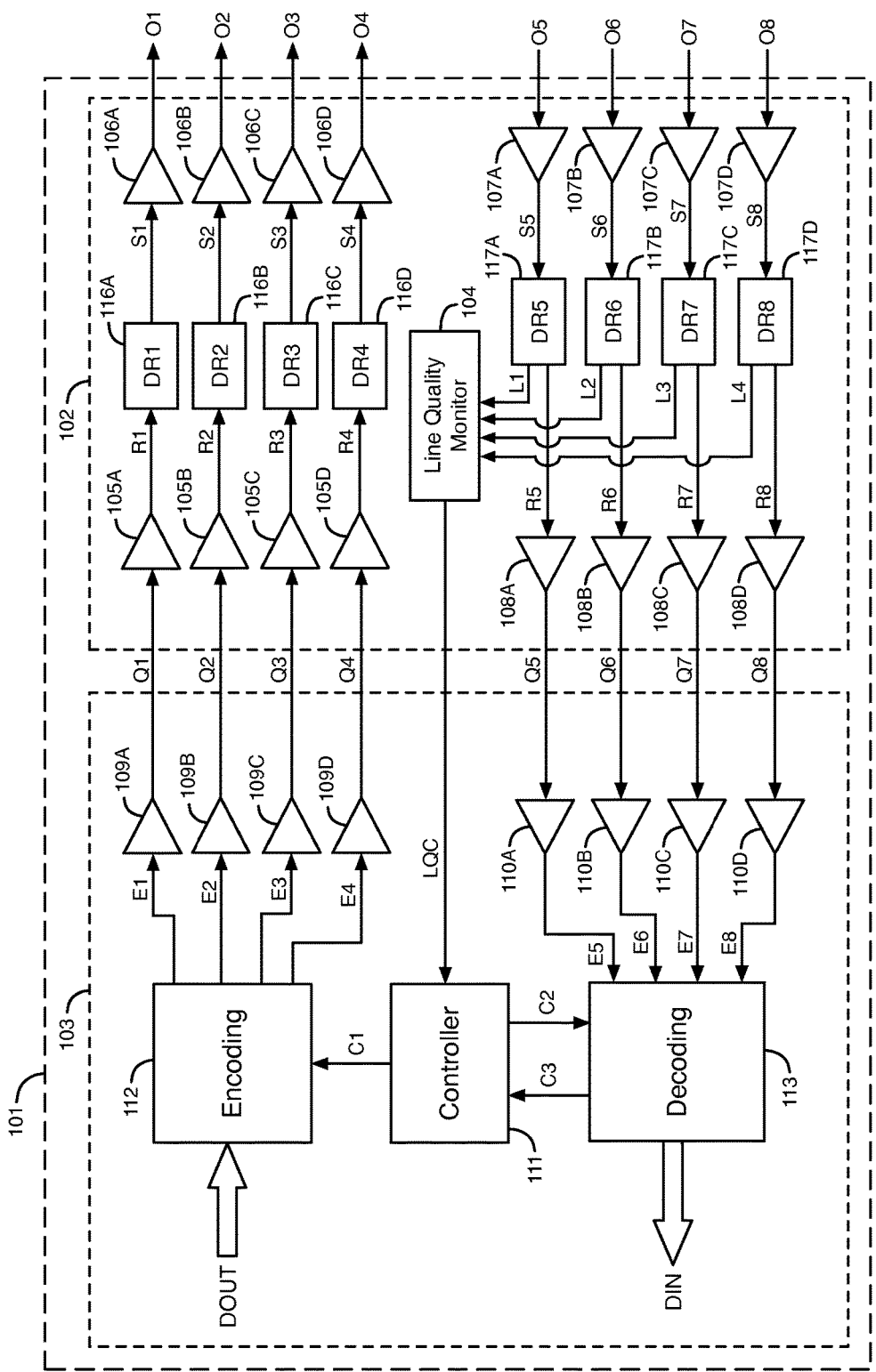
FIG. 1 illustrates a first example of an optical/electrical system, according to an embodiment of the present invention.

A PIC can be used to communicate data through optical networks that have optical fibers. A PIC may be used as an interface between one or more optical networks and an electrical computer system having one or more electrical integrated circuits. The PIC may receive data from the electrical computer system and transmit the data received from the electrical computer system through the one or more optical networks to one or more receiving devices. The PIC may also receive data that is transmitted from one or more transmitting devices through the one or more optical networks. The PIC may then transmit the data received through the one or more optical networks to the electrical computer system.

In order to provide reliable data communication, forward error correction (FEC) may be applied to data that is transmitted through a network. FEC is a technique used in data communication for detecting and correcting errors in data transmitted over unreliable or noisy communication channels. FEC is accomplished by adding redundancy (e.g., error check bits) to the transmitted data using an error correction code. FEC may use one or more error correction codes such as, for example, Reed-Solomon (RS) codes, Bose and Ray-Chaudhuri (BCH) codes, Hamming codes, convolutional codes, Turbo codes, low-density parity-check (LDPC) codes, etc. The redundancy allows a receiver to detect errors that may occur anywhere in a transmitted data signal, and often to correct these errors without retransmission. FEC gives the receiver the ability to correct errors without needing a reverse channel to request that the data be retransmitted. However, FEC uses a higher forward channel bandwidth to accommodate the redundancy or overhead. FEC may be applied in situations where retransmissions are costly, not practical, or impossible.

According to some embodiments disclosed herein, forward error correction (FEC) is provided for data that is transmitted through an optical network to and from an optical/electrical system. The optical/electrical system may include an electrical integrated circuit die and a photonic integrated circuit die. The FEC may, for example, be provided by error correction circuitry in the electrical integrated circuit die and/or in the photonic integrated circuit die. The error correction circuitry may include an encoding circuit and a decoding circuit. The optical/electrical system may include a line quality monitor that determines a line quality of a data signal, such as a bit error rate of one or more data signals transmitted through one or more channels in the optical/electrical system. The line quality monitor includes an eye monitor circuit. The eye monitor circuit may include, for example, a built-in eye oscilloscope. The eye monitor circuit can provide predictive and preventative figures of merit (FOM) using the eye oscilloscope, such as eye-height, eye-width, random jitter (RJ), deterministic jitter (DJ), and bounded uncorrelated jitter (BUJ), for the data signals transmitted through the one or more channels. The error correction circuitry uses the FOM to select a FEC code, such as a Reed-Solomon (RS) code, a Bose and Ray-Chaudhuri (BCH) code, a Hamming code, a convolutional code, a Turbo code, a low-density parity-check (LDPC) code, etc. The encoding circuit and the decoding circuit use the selected FEC code to encode and decode the data transmitted and received, respectively, by one or both of the electrical and photonic integrated circuit dies.

In some embodiments, the electrical integrated circuit (EIC) die and the photonic integrated circuit (PIC) die may be provided in the same package. Thus, a single package device may contain both an EIC die and a PIC die. EIC and PIC dies in the same package may have the functionality of a heterogeneous system on a chip (SOC). The PIC die may transmit and receive data signals through an optical network in the context of a single communication standard or multiple different communication standards. The PIC die may be capable of supporting multiple different applications, including custom applications, if desired. The EIC die may include any type of EIC including, for example, a programmable logic device, a field programmable gate array (FPGA), a programmable logic array, a processor, a microcontroller, a memory device, an analog integrated circuit, a data convert circuit (i.e., analog-to-digital converter (ADC), or digital-to-analog converter (DAC)), an application specific integrated circuit (ASIC), etc.

According to some embodiments, the FEC code used by the error correction circuitry is changed, for example, in response to a change in the line quality or in response to a different communication standard being used. Many communications standards, such as Ethernet, use the same FEC code. For these communications standards, the EIC die and/or the PIC die may include hard non-programmable error correction circuitry that can be shared by two or more data communications channels. The non-programmable error correction circuitry may select among two or more FEC codes. In other embodiments, the EIC die is a programmable integrated circuit, and the error correction circuitry is implemented by programmable circuitry that is configurable to provide different FEC codes. In still other embodiments, the error correction circuitry is implemented partly by non-programmable circuitry and partly by programmable circuitry.

The FEC code used by the error correction circuitry may be changed, for example, between one or more stronger FEC codes and one or more weaker FEC codes. A stronger FEC code typically provides better error correction performance than a weaker FEC code at the expense of using an increased number of logic elements (LEs), more power consumption, and a longer latency. Logic elements are logic circuits that may, for example, be programmable. A weaker FEC code typically requires less LEs, less power consumption, and has a faster latency than a stronger FEC code at the expense of decreased error correction performance. In some embodiments, a weaker FEC code may be a subset of a stronger FEC code, such that two or more weaker FEC codes may be supported with at least some of the same logic circuitry as the stronger FEC code. Thus, it may be advantageous to be able to adjust the FEC code for each communications channel to use the minimum error correction strength required to achieve a desired error rate.

In one example, a limited number of stronger FEC codes may be implemented by non-programmable hard logic circuitry in the EIC die, and one or more additional FEC codes may be implemented by programmable logic circuitry in the EIC die. Implementing FEC codes in programmable logic circuitry typically requires more die area, more power consumption, and increased latency than FEC codes implemented in non-programmable hard logic circuitry. However, implementing FEC codes in programmable logic circuitry offers more flexibility.

FIG. 1 illustrates a first example of an optical/electrical system 101, according to an embodiment of the present invention. Optical/electrical system 101 of FIG. 1 includes a photonic integrated circuit (PIC) die 102 and an electrical integrated circuit (EIC) die 103. System 101 may, for example, include a package that houses both PIC die 102 and EIC die 103. PIC die 102 includes line quality monitor circuit 104, electrical receiver circuits 105A-105D, optical transmitters 106A-106D, optical receivers 107A-107D, electrical transmitter circuits 108A-108D, data recovery circuits 116A-116D (DR1-DR4), and data recovery circuits 117A-117D (DR5-DR8). EIC die 103 may include any type of EIC, as described above, such as an FPGA, an ASIC, etc. EIC die 103 includes controller circuit 111, encoding circuit 112, decoding circuit 113, electrical transmitter circuits 109A-109D, and electrical receiver circuits 110A-110D. Only a portion of each of PIC die 102 and EIC die 103 is shown in FIG. 1 to simplify the drawing.

One or more output data signals DOUT are provided to inputs of encoding circuit 112 from circuitry in EIC die 103 that is not shown in FIG. 1. As an example that is not intended to be limiting, EIC die 103 may be a programmable logic device (PLD), and output data signals DOUT may be generated by programmable logic circuits in a core area of EIC die 103. DOUT may be a single serial signal, multiple serial signals, a set of parallel signals, or multiple sets of parallel signals. EIC die 103 may, for example, include a parallel-to-serial converter circuit for converting parallel output data signals into multiple serial data signals for transmission to PIC die 102.

Encoding circuit 112 performs forward error correction (FEC) encoding on the data indicated by data signals DOUT to generate encoded data in four data signals E1, E2, E3, and E4 using one or more selected error correction codes. Encoding circuit 112 encodes the data indicated by data signals DOUT to generate encoded data as indicated by data signals E1-E4 using a forward error correction (FEC) code or codes that are selected from a set of two, three, or more forward error correction (FEC) codes. The FEC codes in the set of two, three, or more FEC codes may, for example, be stored in storage circuitry in EIC die 103 where they can be accessed by encoding circuit 112. The set of two, three, or more FEC codes may, for example, include two or more of a Reed-Solomon (RS) code, a Bose and Ray-Chaudhuri (BCH) code, a Hamming code, a convolutional code, a Turbo code, a low-density parity-check (LDPC) code, a repeat-accumulate code, etc. Encoding circuit 112 selects the FEC code or codes that are used to encode the data indicated by data signals DOUT to generate encoded data in data signals E1-E4 from the set of two or more FEC codes based on one or more control signals C1. Control signals C1 are generated by controller circuit 111.

Data signals E1, E2, E3, and E4 are provided to inputs of electrical transmitter circuits 109A, 109B, 109C, and 109D, respectively. Electrical transmitter circuits 109A-109D generate electrical output data signals Q1, Q2, Q3, and Q4 based on data signals E1, E2, E3, and E4, respectively. Output data signals Q1-Q4 indicate the same encoded data that is indicated by data signals E1-E4, respectively. Output data signals Q1-Q4 may be four serial data signals or a set of four parallel data signals. Four data signals E1-E4, four transmitter circuits 109A-109D, and four output data signals Q1-Q4 are shown in FIG. 1 as an example. In other embodiments, EIC die 103 may include any number of transmitter circuits 109 and a corresponding number of data signals. Electrical transmitter circuits 109 and other electrical transmitter circuits disclosed herein may, for example, include buffer circuits, pre-emphasis/de-emphasis circuits, and other circuitry for transmitting electrical signals from one integrated circuit die to another.

Electrical output data signals Q1, Q2, Q3, and Q4 are provided through four external conductors in system 101 to inputs of electrical receiver circuits 105A, 105B, 105C, and 105D, respectively, in PIC die 102. Electrical receiver circuits 105A-105D generate electrical data signals R1, R2, R3, and R4 based on electrical data signals Q1, Q2, Q3, and Q4, respectively. Electrical data signals R1-R4 indicate the same encoded data that is indicated by data signals Q1-Q4, respectively. Electrical receiver circuits 105A-105D and other electrical receiver circuits disclosed herein may, for example, include sampler circuits that sample incoming electrical data signals in response to one or more clock or control signals to generate corresponding sampled electrical data signals.

Electrical data signals R1-R4 are provided to inputs of data recovery (DR) circuits 116A-116D, respectively. DR circuits 116A-116D generate electrical data signals S1, S2, S3, and S4 based on electrical data signals R1, R2, R3, and R4, respectively, using one or more data recovery techniques. For example, DR circuits 116A-116D may include clock data recovery circuits, decision feedback equalizer (DFE) circuits, linear equalizer circuits, adaptive equalizer circuits, other types of equalizers, re-timer circuits, signal modulator circuits, and/or other circuitry for identifying and recovering received data. DR circuits 116A-116D may provide one or more clock signals or control signals to receiver circuits 105A-105D for sampling data signals Q1-Q4. Data signals S1-S4 indicate the same encoded data that is indicated by data signals R1-R4, respectively. As shown in FIG. 1, data signals S1, S2, S3, and S4 are provided to inputs of optical transmitters 106A, 106B, 106C, and 106D, respectively. In an alternative embodiment, PIC die 102 does not include data recovery (DR) circuits 116A-116D, and data signals R1, R2, R3, and R4 are provided directly to inputs of optical transmitters 106A, 106B, 106C, and 106D, respectively.

Optical transmitters 106A-106D generate optical output data signals O1, O2, O3, and O4 based on electrical data signals S1, S2, S3, and S4, respectively. Optical data signals O1-O4 indicate the same encoded data that is indicated by data signals S1-S4, respectively. Optical transmitters 106A-106D may, for example, include light-emitting diodes (LEDs) or laser diodes. Optical transmitters 106A-106D transmit optical data signals O1-O4 through one or more optical networks to one or more external devices that are outside system 101. Optical data signals O5, O6, O7, and O8 are provided from one or more external devices that are outside system 101 through the one or more optical networks to system 101.

In an exemplary embodiment, the forward error correction (FEC) code or codes selected by encoding circuit 112 may be communicated to the one or more external devices that receive optical signals O1-O4. The one or more external devices that receive signals O1-O4 use the received FEC code or codes to decode signals O1-O4. The one or more external devices that transmit signals O5-O8 may use the received FEC code or codes to encode signals O5-O8. FEC code or codes may be communicated from EIC die 103 to the one or more external devices through any type of signaling, for example, in a field in a header within a data packet.

Optical data signals O5, O6, O7, and O8 are provided from the one or more external devices that are outside system 101 through the one or more optical networks to inputs of optical receivers 107A, 107B, 107C, and 107D, respectively. Optical data signals O5-O8 indicate encoded data. Optical receivers 107A-107D may be, for example, photodetector circuits, such as photodiodes (e.g., Avalanche Photodiode (APD), PIN Photodiode, etc.). Optical receivers 107A-107D generate electrical data signals S5, S6, S7, and S8 based on optical data signals O5, O6, O7, and O8, respectively. Electrical data signals S5-S8 indicate the same encoded data that is indicated by optical data signals O5-O8, respectively.

Electrical data signals S5-S8 are provided to inputs of data recovery (DR) circuits 117A-117D, respectively. DR circuits 117A-117D generate electrical data signals R5, R6, R7, and R8 based on electrical data signals S5, S6, S7, and S8, respectively, using one or more data recovery techniques. For example, DR circuits 117A-117D may include sampler circuits, clock data recovery circuits, decision feedback equalizer (DFE) circuits, linear equalizer circuits, adaptive equalizer circuits, other types of equalizer circuits, re-timer circuits, signal modulator circuits, and/or other circuitry for identifying and recovering the received data. Data signals R5-R8 indicate the same encoded data that is indicated by data signals S5-S8, respectively.

DR circuits 117A-117D also generate electrical data signals L1, L2, L3, and L4 based on electrical data signals S5, S6, S7, and S8, respectively, using the one or more data recovery techniques. Data signals L1-L4 indicate the same encoded data that is indicated by data signals S5-S8, respectively. In one embodiment, signals L1-L4 are signals R5-R8, respectively. In another embodiment, signals L1-L4 are signals S5-S8, respectively. In other embodiments, signals L1-L4 are intermediate signals that DR circuits 117A-117D generate between signals S5-S8 and the generation of signals R5-R8, respectively. Signals L1-L4 are provided to inputs of line quality monitor circuit 104.

Data signals R5-R8 are provided to inputs of electrical transmitter circuits 108A-108D, respectively. Electrical transmitter circuits 108A-108D generate electrical output data signals Q5, Q6, Q7, and Q8 based on electrical data signals R5, R6, R7, and R8, respectively. Output data signals Q5-Q8 indicate the same encoded data that is indicated by data signals R5-R8, respectively. Electrical transmitter circuits 108A-108D and other electrical transmitter circuits disclosed herein may, for example, include buffer circuits, pre-emphasis/de-emphasis circuits, and other circuitry for transmitting electrical signals from one integrated circuit die to another. Although 4 receiver circuits 105, 4 transmitters 106, 4 receivers 107, and 4 transmitter circuits 108 are shown in FIG. 1, in other embodiments, PIC die 102 may have any number of receiver and transmitter circuits for receiving and transmitting a corresponding number of data signals.

Electrical output data signals Q5, Q6, Q7, and Q8 are provided through four external conductors in system 101 to inputs of electrical receiver circuits 110A, 110B, 110C, and 110D, respectively, in EIC die 103. Electrical receiver circuits 110A, 110B, 110C, and 110D generate electrical data signals E5, E6, E7, and E8 based on electrical data signals Q5, Q6, Q7, and Q8, respectively. Electrical data signals E5-E8 indicate the same encoded data that is indicated by data signals Q5-Q8, respectively. Electrical receiver circuits 110A-110D may, for example, include sampler circuits that sample incoming electrical data signals in response to one or more clock or control signals to generate corresponding sampled electrical data signals E5-E8, respectively. Electrical receiver circuits 110A-110D may also include clock data recovery circuits, decision feedback equalizer (DFE) circuits, linear equalizer circuits, adaptive equalizer circuits, other types of equalizers, re-timer circuits, signal modulator circuits, and/or other circuitry for identifying and recovering received data. Although 4 receiver circuits 110 are shown in FIG. 1, in other embodiments, EIC die 103 may have any number of receiver circuits for receiving a corresponding number of data signals.

Electrical data signals E5-E8 are provided to inputs of decoding circuit 113. Decoding circuit 113 performs forward error correction (FEC) decoding on the encoded data indicated by data signals E5-E8 to generate decoded data in data signals DIN using one or more selected forward error correction (FEC) codes. Decoding circuit 113 decodes the encoded data indicated by data signals E5-E8 to generate decoded data as indicated by data signals DIN using one or more FEC codes that are selected from a set of two, three, or more FEC codes. The set of two, three, or more FEC codes used by decoding circuit 113 may be the same set of FEC codes that is used by encoding circuit 112. Decoding circuit 113 may, for example, use a hard decision decoding algorithm or a soft decision decoding algorithm.

In an embodiment, decoding circuit 113 decodes the encoded data indicated by data signals E5-E8 to generate decoded data in data signals DIN using the same FEC code or codes concurrently used by encoding circuit 112 to generate the encoded data in signals E1-E4. In another embodiment that uses asymmetric optical links, decoding circuit 113 may decode the encoded data indicated by data signals E5-E8 to generate decoded data in data signals DIN using a different FEC code or codes than the FEC code or codes concurrently used by encoding circuit 112 to generate the encoded data in signals E1-E4. In this embodiment, the FEC code used by decoding circuit 113 may, for example, be communicated to EIC die 103 from PIC die 102 or from an external device.

Decoding circuit 113 selects the FEC code or codes that it uses to decode the encoded data indicated by data signals E5-E8 to generate decoded data in data signals DIN from the set of two, three, or more FEC codes based on one or more control signals C2. Control signals C2 are generated by controller circuit 111. Controller circuit 111 may cause encoding circuit 112 and decoding circuit 113 to use the same or different FEC codes for encoding and decoding, respectively. Data signals DIN are provided to other circuitry in EIC die 103 that is not shown in FIG. 1 (e.g., programmable logic circuits in a PLD).

Line quality monitor (LQM) circuit 104 determines a likely bit error rate (BER) for the data indicated by one, a subset of, or all of the data signals L1-L4. In some embodiments, LQM circuit 104 includes an eye monitor circuit. The eye monitor circuit may be, for example, an eye-scope or eye-viewer. Eye monitor circuit 104 may include, for example, a built-in eye oscilloscope.

Figure 4:
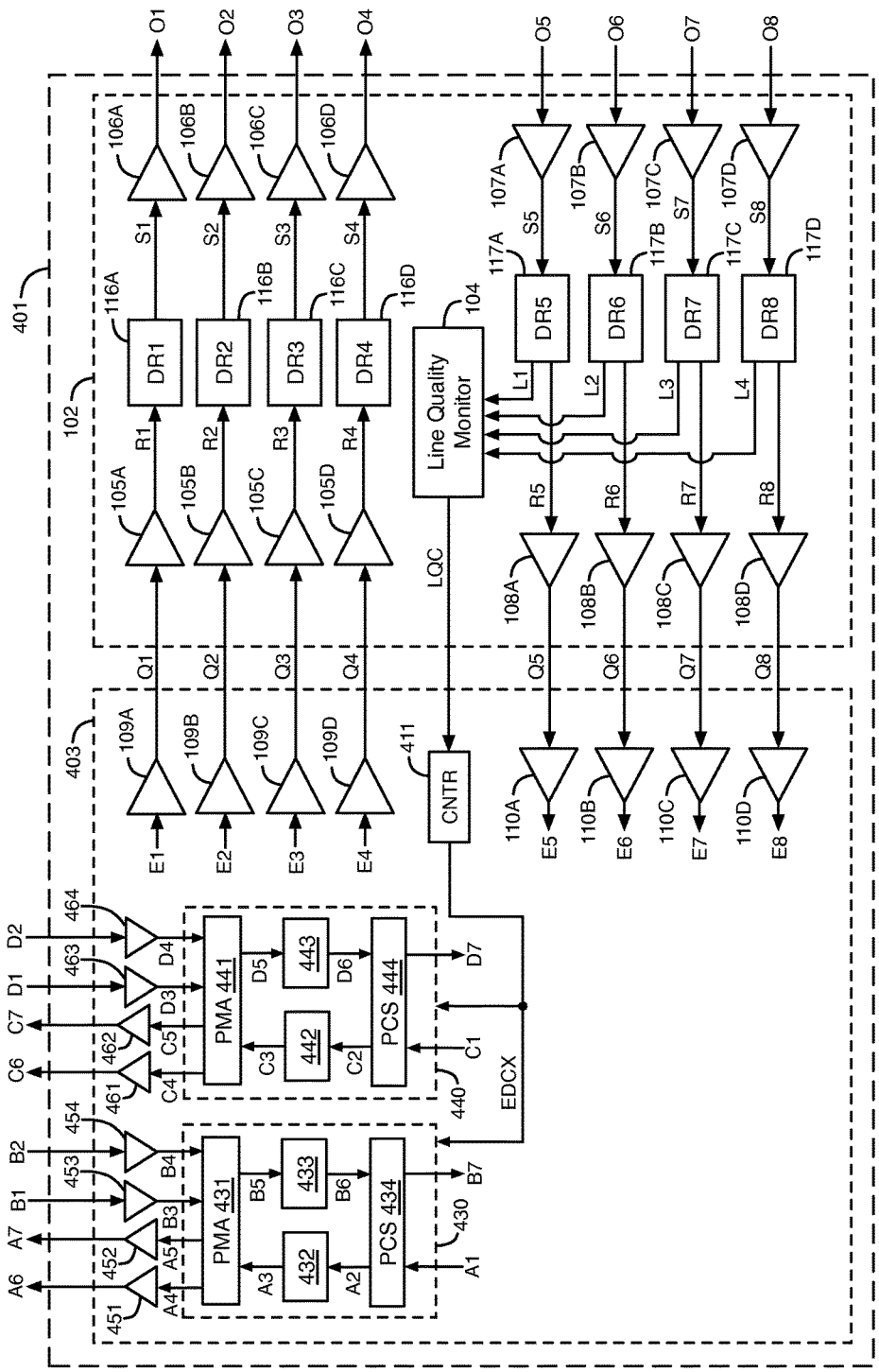
FIG. 4 illustrates a fourth example of an optical/electrical system, according to yet another embodiment of the present invention.

The eye monitor circuit in LQM circuit 104 of FIG. 1 may, as an example, have the architecture of the eye monitor circuitry 100 disclosed with respect to FIG. 4 of commonly-assigned U.S. Pat. No. 8,111,784, which is incorporated by reference herein in its entirety. As another example, the eye monitor circuit in LQM circuit 104 of FIG. 1 shown herein may have the architecture of the eye-viewer circuitry 14 or the eye viewer circuitry 42 that are disclosed in commonly-assigned U.S. Pat. No. 8,451,883, which is incorporated by reference herein in its entirety. As yet another example, the eye monitor circuit in LQM circuit 104 shown in FIG. 1 herein may have the architecture of the eye viewer 130 disclosed in commonly-assigned U.S. Pat. No. 8,433,958, which is incorporated by reference herein in its entirety. As still another example, the eye monitor circuit in LQM circuit 104 shown in FIG. 1 herein may have the architecture of the eye viewer circuitry 14, the eye viewer circuitry 42, or the eye viewer circuitry 148 disclosed in commonly-assigned U.S. Pat. No. 8,744,012, which is incorporated by reference herein in its entirety.

The eye monitor circuit in LQM circuit 104 monitors signals L1-L4 to determine figures of merit (FOM) of signals L1-L4. The FOM may be predictive and/or preventive. For example, the eye monitor circuit in LQM circuit 104 may determine a dimension of an eye of one or more of signals L1-L4, such as the eye-height (EH) and/or the eye-width (EW) of signals L1-L4, using the eye oscilloscope. As other examples, the eye monitor circuit in LQM circuit 104 may determine the random jitter (RJ), the deterministic jitter (DJ), and/or the bounded uncorrelated jitter (BUJ) in signals L1-L4 using the eye oscilloscope. The EH, EW, RJ, DJ, and BUJ of signals L1-L4 are examples of the figures of merit. The eye monitor circuit in LQM circuit 104 may determine one of, a subset of, or all of the EH, EW, RJ, DJ, BUJ, and/or other figures of merit of signals L1-L4.

In an alternative embodiment, LQM circuit 104 monitors the output signals of transmitter circuits 108A-108D in PIC die 102. In yet another alternative embodiment, LQM circuit 104 is in EIC die 103 and monitors the output signals of receiver circuits 110A-110D.

The EH, EW, RJ, DJ, and BUJ indicate the channel/medium characteristics of the data signals provided through the channels/medium connected to circuits 107A-107D of FIG. 1 that include circuits 107-108 and 117. The channel/medium characteristics of the data signals provided through these channels connected to circuits 107A-107D of FIG. 1 may also be indicated by other figures of merit. Line quality monitor circuit 104 uses the figures of merit (e.g., one of, a subset of, or all of the EH, EW, RJ, DJ, and BUJ of signals L1-L4) to determine the line quality of the data signals L1-L4. The line quality of the data signals determined by line quality monitor circuit 104 may include a likely bit error rate (BER) in signals L1-L4. Line quality monitor circuit 104 may determine the BER based on the EH, EW, RJ, DJ, BUJ, and/or other figures of merit of signals L1-L4.

Line quality monitor (LQM) circuit 104 generates one or more line quality control signals LQC that indicate the line quality of the data signals L1-L4 determined based on the figures of merit generated by the eye monitor circuit. Signals LQC may, for example, indicate the BER of signals L1-L4 and/or one or more of the figures of merit including the EH, EW, RJ, DJ, and/or BUJ of signals L1-L4 that were determined by the eye monitor circuit. LQC may, for example, be a serial digital signal, multiple serial digital signals, multiple parallel digital signals, or one or more analog signals. LQC are provided to controller circuit 111.

According to another alternative embodiment, line quality monitor (LQM) circuit 104 is in EIC die 103 instead of being in PIC die 102. In this embodiment, signals L1-L4 are transmitted from PIC die 102 to EIC die 103 to inputs of LQM circuit 104. LQM circuit 104 generates line quality control signals LQC based on signals L1-L4 as described herein. Signals LQC are provided to controller circuit 111 through conductors in EIC die 103 in this embodiment.

In an exemplary embodiment, controller circuit 111 may include a finite state machine that performs the functions described herein with respect to controller circuit 111. Controller circuit 111 may be, for example, a processor circuit or part of a processor circuit.

Controller circuit 111 and line quality monitor (LQM) circuit 104 select the forward error correction (FEC) code or codes used by encoding circuit 112 and decoding circuit 113 by examining the line quality indicated by the line quality control signals LQC. Controller circuit 111 generates control signals C1 and C2 based on the line quality control signals LQC generated by LQM circuit 104. Controller circuit 111 generates values for control signals C1 and C2 based on the line quality indicated by signals LQC that cause encoding circuit 112 and decoding circuit 113, respectively, to select FEC codes that generate desired channel characteristics for the data signals L1-L4. Using the line quality to select the FEC codes may result in fewer errors in the transmitted data.

As an example, if signals LQC indicate that the bit error rate (BER) of one or more of signals L1-L4 has increased above a threshold, controller circuit 111 may adjust the values of signals C1 and C2 to cause encoding circuit 112 and decoding circuit 113 to select a different and stronger FEC code for performing the encoding of signals E1-E4 and the decoding of signals E5-E8, respectively. A stronger FEC code may be an error correction code that detects and corrects a larger percentage of bit errors in a given amount of data than a weaker error correction code. The stronger error correction code decreases the BER in data signals O1-O8, but may cause increased logic element (LE) usage, increased power consumption, and increased latency in system 101.

As another example, if signals LQC indicate that the bit error rate (BER) of one or more of signals L1-L4 has decreased below a threshold, controller circuit 111 may adjust the values of signals C1 and C2 to cause encoding circuit 112 and decoding circuit 113 to select a different and weaker FEC code for performing the encoding of signals E1-E4 and the decoding of signals E5-E8, respectively. A weaker FEC code may be an error correction code that detects and corrects a smaller percentage of bit errors in a given amount of data than a stronger error correction code. The weaker error correction code increases the BER in data signals O1-O8, while using less logic elements (LEs), less power consumption, and having a reduced latency in system 101.

In some embodiments, encoding circuit 112 may contain multiple encoders. As an example, encoding circuit 112 may have a different encoder for each of the four channels 109A-109D for a total of four encoders, and each of the four encoders may generate encoded data in a different one of signals E1, E2, E3, and E4. As a specific example, if the encoded data indicated by signals E1-E4 are transmitted through a 100 Gigabits per second (Gbs) Ethernet network (i.e., a 100 G Ethernet), 4 encoders in encoding circuit 112 may generate encoded data in signals E1-E4, such that each of the 4 encoders generates encoded data in a respective signal E1-E4 at a rate of 25 Gbs. In these embodiments, decoding circuit 113 may contain multiple decoders. For example, decoding circuit 113 may have a different decoder for each of the lanes 110A-110D for a total of four decoders, and each of the four decoders may decode encoded data indicated by a different one of signals E5, E6, E7, and E8. As a specific example, if the encoded data indicated by signals E5-E8 are transmitted through a 100 G Ethernet, 4 decoders in decoding circuit 113 may decode encoded data in signals E5-E8, such that each of the 4 decoders generates decoded data in DIN at a rate of 25 Gbs. In other embodiments, the encoders in circuit 112 and the decoders in circuit 113 may generate encoded data or decode encoded data, respectively, at rates of 50 Gbs, 100 Gbs, 200 Gbs, 400 Gbs (i.e., 400G Ethernet), etc., depending on the data rate of the transmission network and the number of channels and signals.

In another embodiment, encoding circuit 112 has a faster encoder that is shared by the four channels and that encodes the data indicated by data signals E1-E4. In this embodiment, decoding circuit 113 may have a faster decoder that is shared by all four lanes and that decodes encoded data indicated by data signals E5-E8. For example, if the encoded data indicated by signals E1-E4 are transmitted through a first 100 G Ethernet, and the encoded data indicated by signals E5-E8 are transmitted through a second 100 G Ethernet, one encoder in circuit 112 generates encoded data for all four 25 Gbs signals E1-E4, and one decoder in circuit 113 decodes encoded data in all four 25 Gbs signals E5-E8. As another example, if the encoded data indicated by signals E1-E4 are transmitted through a first 400 G Ethernet, and the encoded data indicated by signals E5-E8 are transmitted through a second 400 G Ethernet, one encoder in circuit 112 generates encoded data for all four 100 Gbs signals E1-E4, and one decoder in circuit 113 decodes encoded data in all four 100 Gbs signals E5-E8.

In still another embodiment, encoding circuit 112 has multiple faster encoders that are shared by the four channels and that in combination encode the data indicated by data signals E1-E4. In this embodiment, decoding circuit 113 may have multiple faster decoders that are shared by all four channels and that in combination decode the encoded data indicated by data signals E5-E8.

In an embodiment, EIC die 103 is a programmable logic device, and circuits 112-113 are in a hard input/output ring of the EIC die 103. In this embodiment, circuits 112-113 exchange data between the hard input/output ring and the programmable logic core circuitry of the EIC die 103. Thus, data signals DOUT are received from the programmable logic core circuitry, and data signals DIN are provided to the programmable logic core circuitry.

In an embodiment, controller circuit 111 may also contain a bit error rate (BER) counter circuit that determines a BER based on error information received from decoding circuit 113 in signals C3 to verify that the FEC code selection achieved a desired BER in signals E5-E8. The BER counter circuit may count the number of errors indicated by the error information to determine the BER. If the counter circuit indicates that the FEC code selection did not achieve less than a maximum desired BER, controller circuit 111 may select a new FEC code for encoding circuit 112 and decoding circuit 113 to reduce the BER. If the counter circuit indicates that the BER is less than a minimum BER threshold, then controller circuit 111 may select a weaker FEC code for encoding circuit 112 and decoding circuit 113 to reduce power and latency. Thus, controller circuit 111 may use the counter circuit to determine if the BER in signals E5-E8 is within a desired range of BERs. The BER counter circuit may, for example, determine the BER based on the error information after controller circuit 111 selects a FEC code based on the line quality information in signals LQC from circuit 104.

Figure 2:
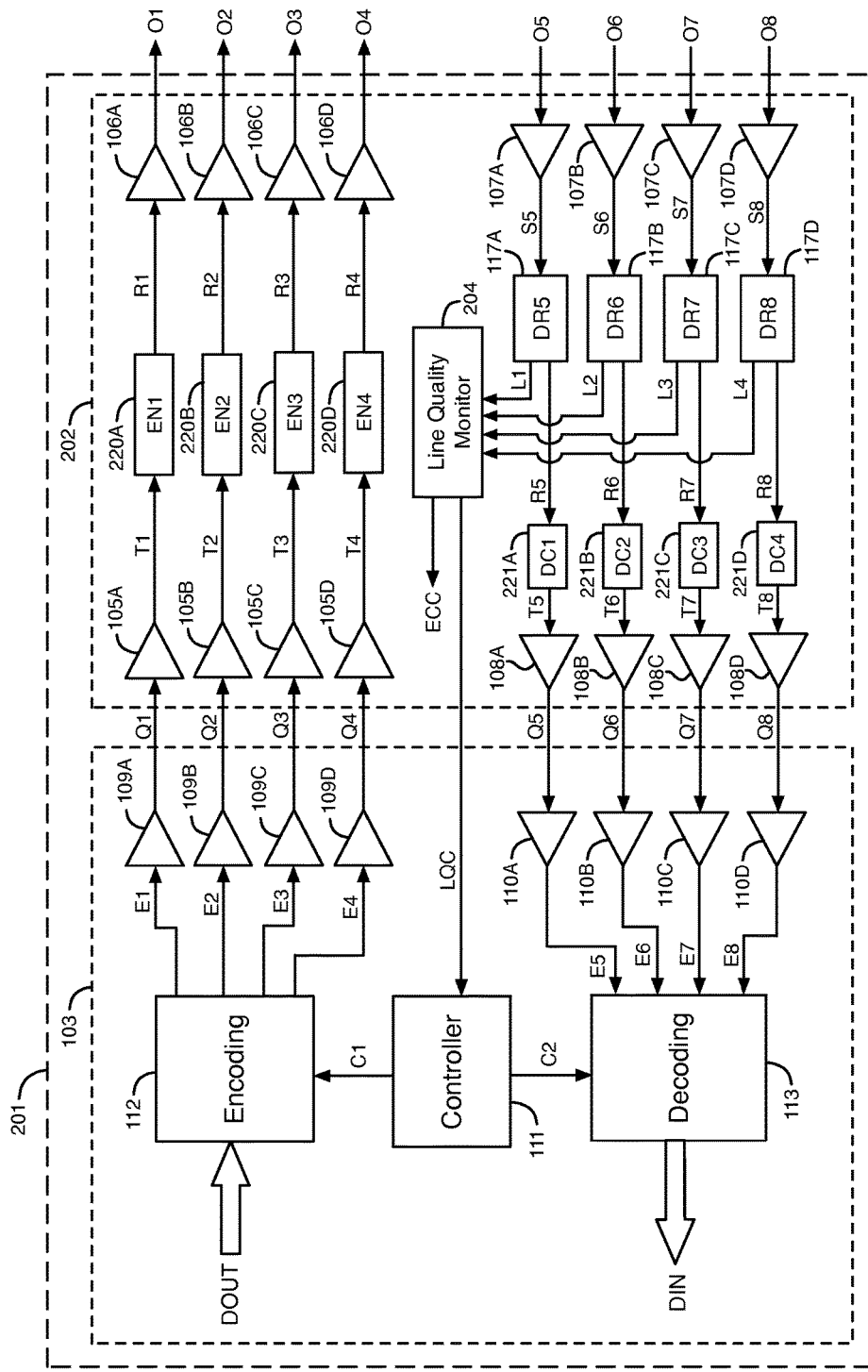
FIG. 2 illustrates a second example of an optical/electrical system, according to another embodiment of the present invention.

FIG. 2 illustrates a second example of an optical/electrical system 201, according to another embodiment of the present invention. Optical/electrical system 201 of FIG. 2 includes a photonic integrated circuit (PIC) die 202 and electrical integrated circuit (EIC) die 103. System 201 may, for example, include a package that houses both PIC die 202 and EIC die 103. PIC die 202 includes line quality monitor circuit 204, electrical receiver circuits 105A-105D, optical transmitters 106A-106D, optical receivers 107A-107D, electrical transmitter circuits 108A-108D, data recovery circuits 117A-117D (DR5-DR8), FEC encoding circuits 220A-220D, and FEC decoding circuits 221A-221D. EIC die 103 of FIG. 2 includes the same components that are shown in FIG. 1. Each of PIC die 202 and EIC die 103 includes other circuits that are not shown in FIG. 2 to simplify the drawing.

In the embodiment of FIG. 2, PIC die 202 includes FEC encoding circuits 220A-220D (EN1-EN4) and FEC decoding circuits 221A-221D (DC1-DC4). In an embodiment, FEC encoding circuits 220A-220D and FEC decoding circuits 221A-221D may be implemented by non-programmable circuitry in PIC die 202. FEC encoding circuits 220A-220D and FEC decoding circuits 221A-221D add additional forward error correction (FEC) to the data transmitted through an optical network. Adding additional forward error correction (FEC) to the transmitted data may allow the bit rate of the optical signals O1-O8 to be increased. The additional forward error correction (FEC) provided by circuits 220A-220D and 221A-221D is transparent in the first instance to the EIC die 103. The forward error correction (FEC) code used in PIC die 202 may be different than the FEC code used in EIC die 103. For example, the FEC code performed in PIC die 202 may be weaker or stronger than the FEC code performed in EIC die 103.

In some embodiments, encoding circuits 220A-220D and decoding circuits 221A-221D may use one or more FEC algorithms that are different than and independent of the one or more FEC algorithms used by encoding circuit 112 and decoding circuit 113. In another embodiment, system 201 may provide FEC to data transmitted through an optical network using a composite FEC code that is a combination of an inner component code and an outer component code. As an example, encoding circuit 112 may provide FEC encoding using the outer component code, and encoding circuits 220A-220D may provide FEC encoding using the inner component code. In this example, the decoding circuits 221A-221D may provide FEC decoding using the inner component code, and decoding circuit 113 may provide FEC decoding using the outer component code.

In another embodiment, the FEC codes used by encoding circuits 112 and 220A-220D for encoding can be combined into a multidimensional FEC code, such as a product code. In this embodiment, decoding circuits 113 and 221A-221D use the multidimensional FEC code for decoding the received encoded data. With a multidimensional FEC code or multi-bit modulation, such as a high order quadrature amplitude modulation (e.g., PAM4, PAM8, QAM4, QAM8), encoding circuit 112 may, for example, use a first FEC code to encode the higher order bits, encoding circuits 220A-220D may use a different second FEC code to encode the lower order bits, decoding circuits 221A-221D may decode the lower order bits using the second FEC code, and decoding circuit 113 may decode the higher order bits using the first FEC code.

Encoding circuit 112 encodes data in signals DOUT to generate encoded output data signals E1-E4 and Q1-Q4, as described herein with respect to FIG. 1. Encoded data signals Q1-Q4 are provided to inputs of electrical receiver circuits 105A-105D from transmitter circuits 109A-109D, respectively, in PIC die 202, as shown in FIG. 2. Electrical receiver circuits 105A-105D generate electrical data signals T1, T2, T3, and T4 based on electrical data signals Q1, Q2, Q3, and Q4, respectively, in the embodiment of FIG. 2. Electrical data signals T1-T4 indicate the same encoded data that is indicated by data signals Q1-Q4, respectively.

FEC encoding circuits 220A-220D receive electrical data signals T1-T4 from electrical receiver circuits 105A-105D, respectively. FEC encoding circuits 220A-220D encode the encoded data indicated by data signals T1-T4 using a forward error correction (FEC) code to generate encoded data indicated by four data signals R1, R2, R3, and R4, respectively. Thus, FEC encoding circuits 220A-220D provide another layer of error correction encoding to the encoded data on top of the error correction encoding provided by encoding circuit 112. FEC encoding circuits 220A-220D may use any suitable forward error correction code, such as for example, a Reed-Solomon (RS) code, a Bose and Ray-Chaudhuri (BCH) code, a Hamming code, a convolutional code, a Turbo code, a low-density parity-check (LDPC) code, a repeat-accumulate code, a product code, etc. Signals R1-R4 are provided to inputs of optical transmitter circuits 106A-106D, respectively. Optical transmitters 106A-106D generate optical output data signals O1-O4 based on electrical data signals R1-R4, respectively. Optical data signals O1-O4 indicate the same encoded data that is indicated by data signals R1-R4, respectively. In the embodiment of FIG. 2, PIC die 202 does not include data recovery circuits in the transmitting channels.

In system 201, circuits 107A-107D and 117A-117D function as described herein with respect to FIG. 1. In the embodiment of FIG. 2, FEC decoding circuits 221A-221D receive electrical data signals R5-R8 from circuits 117A-117D, respectively. FEC decoding circuits 221A-221D decode the encoded data indicated by data signals R5-R8 using a forward error correction code to generate partially decoded data indicated by four data signals T5, T6, T7, and T8, respectively. The forward error correction code used by FEC decoding circuits 221A-221D may be the same forward error correction code used by FEC encoding circuits 220A-220D. Signals T5-T8 are provided to inputs of transmitter circuits 108A-108D.

Electrical transmitter circuits 108A-108D generate electrical output data signals Q5, Q6, Q7, and Q8 based on electrical data signals T5, T6, T7, and T8, respectively. Data signals Q5-Q8 indicate the same encoded data that is indicated by data signals T5-T8, respectively. Signals Q5-Q8 are provided to inputs of electrical receiver circuits 110A-110D, respectively, as described with respect to FIG. 1. Decoding circuit 113 decodes the encoded data indicated by signals E5-E8 to generate the decoded data signals DIN, as described herein with respect to FIG. 1.

Line quality monitor (LQM) circuit 204 performs the functions of LQM circuit 104 as described herein with respect to FIG. 1. The eye monitor circuit in LQM circuit 204 may include, for example, an eye oscilloscope. In an exemplary embodiment, LQM circuit 204 also generates error correction control (ECC) signals based on the line quality of signals L1-L4. Control signals ECC are provided to control inputs of each of FEC encoding circuits 220A-220D and each of FEC decoding circuits 221A-221D through conductors. In this embodiment, the forward error correction (FEC) code that is used by FEC encoding circuits 220A-220D and FEC decoding circuits 221A-221D to perform error correction encoding and decoding of signals T1-T4 and Q5-Q8, respectively, is selected based on the values of control signals ECC. LQM circuit 204 selects the FEC code using signals ECC based on the line quality of signals L1-L4 as indicated by the figures of merit, such as the EW, EH, RJ, DJ, and/or the BUJ of signals L1-L4. Thus, in this embodiment, LQM circuit 204 varies the FEC code or codes used by FEC encoding circuits 220A-220D and FEC decoding circuits 221A-221D based on changes in the line quality of signals L1-L4.

FIG. 2 shows one encoding circuit 220 and one decoding circuit 221 per channel. In alternative embodiments, there may be a smaller number of faster encoding circuits and/or decoding circuits that each encode or decode the data provided through multiple channels. For example, PIC die 202 may have a faster encoding circuit for signals T1-T4 and a faster decoding circuit for signals Q5-Q8.

Figure 3:
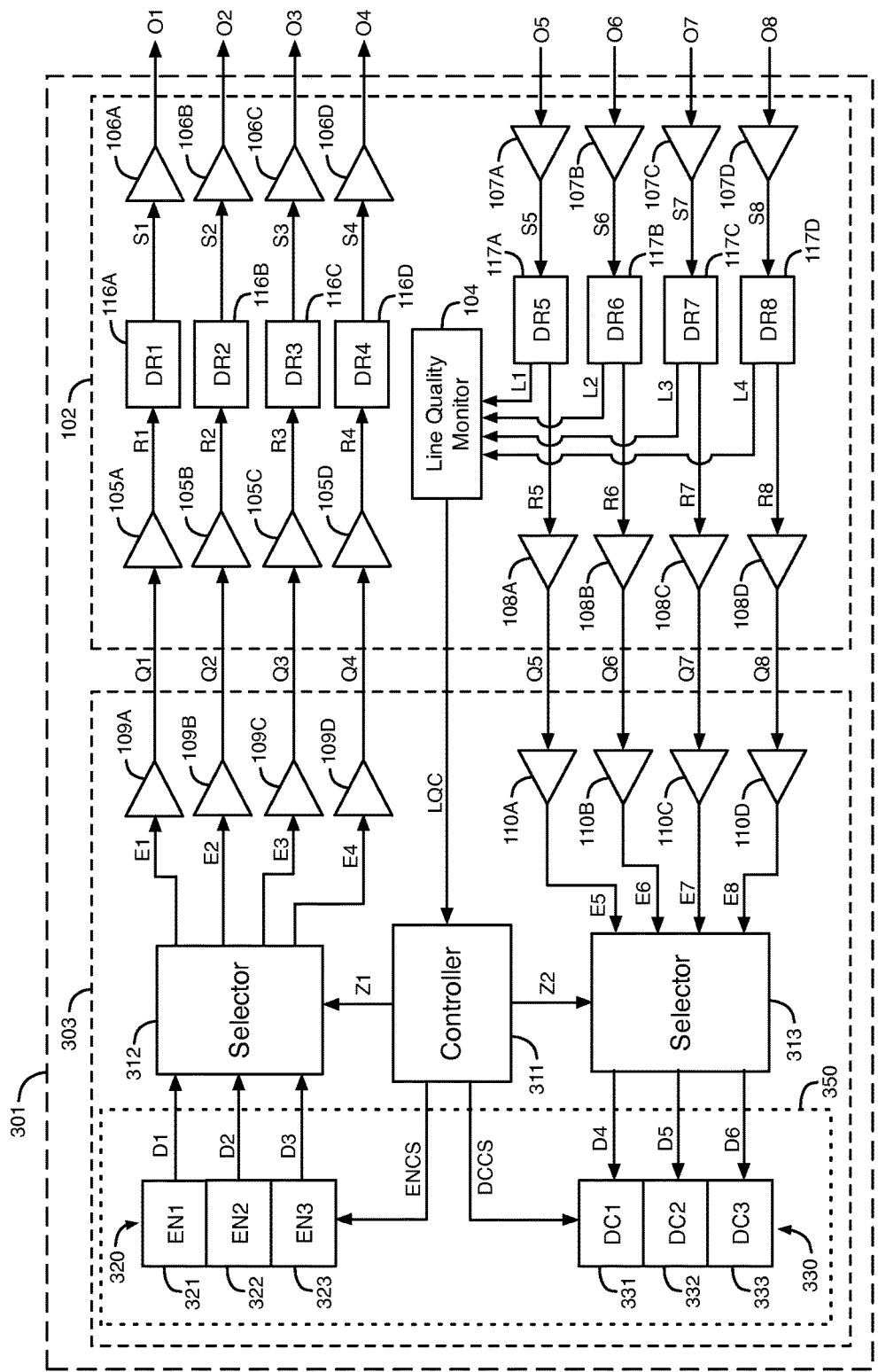
FIG. 3 illustrates a third example of an optical/electrical system, according to yet another embodiment of the present invention.

FIG. 3 illustrates a third example of an optical/electrical system 301, according to an embodiment of the present invention. Optical/electrical system 301 of FIG. 3 includes PIC die 102 and electrical integrated circuit (EIC) die 303. System 301 may, for example, include a package that houses both PIC die 102 and EIC die 303. EIC die 303 includes electrical transmitter circuits 109A-109D, electrical receiver circuits 110A-110D, controller circuit 311, selector circuit 312, selector circuit 313, encoding circuit 320 that includes component FEC encoder circuits 321-323, and decoding circuit 330 that includes component FEC decoder circuits 331-333. EIC die 303 includes other circuits that are not shown in FIG. 3 to simplify the drawing. In an alternative embodiment, system 301 includes PIC die 202 with the embedded FEC encoding and decoding circuits, instead of PIC die 102.

EIC die 303 is a programmable logic integrated circuit that includes a region 350 of programmable logic circuits. Region 350 includes programmable logic circuits that implement encoding circuit 320 and decoding circuit 330. The programmable logic circuits in region 350, including encoding circuit 320 and decoding circuit 330, are fully and/or partially reconfigurable.

FEC encoder circuits 321-323 are capable of performing forward error correction (FEC) encoding using three different FEC codes. FEC encoder circuits 321-323 can perform FEC encoding using first, second, and third FEC codes, respectively. FEC decoder circuits 331-333 are capable of performing FEC decoding using three different FEC codes. FEC decoder circuits 331-333 can perform FEC decoding using the first, the second, and the third FEC codes, respectively.

In system 301, line quality control signals LQC are provided from LQM circuit 104 to inputs of controller circuit 311. Controller circuit 311 generates encoder control signals ENCS and decoder control signals DCCS based on the line quality indicated by signals LQC. Control signals ENCS are provided to control inputs of FEC encoder circuits 321-323. Control signals ENCS determine which one of the three FEC encoder circuits 321-323 is enabled to encode data. Only one of the three FEC encoder circuits 321-323 is enabled at any one time based on the values of signals ENCS to generate encoded data using the respective first, second, or third FEC code. The encoded data generated by the enabled FEC encoder circuit 321, 322, or 323 is provided in a respective data signal D1, D2, or D3. The generated data signal D1, D2, or D3 may include one or multiple signals.

The generated data signal D1, D2, or D3 is provided to an input of selector circuit 312. Controller circuit 311 also generates select signals Z1 that are provided to select inputs of selector circuit 312. Selector circuit 312 selects the data signal D1, D2, or D3 generated by the enabled FEC encoder circuit 321, 322, or 323, respectively, based on the values of signals Z1. Controller circuit 311 generates values for signals ENCS and Z1 that cause selector circuit 312 to select the data signal D1, D2, or D3 generated by the enabled FEC encoder circuit 321, 322, or 323, respectively. Selector circuit 312 provides the encoded data indicated by the selected data signal D1, D2, or D3 to transmitter circuits 109A-109D as signals E1-E4, respectively. In system 301, circuits 109A-109D, circuits 110A-110D, and PIC die 102 function as described herein with respect to FIG. 1. Signals E1-E4 may be parallel or serial signals.

In system 301, data signals E5-E8 are provided from receiver circuits 110A-110D to inputs of selector circuit 313. Controller circuit 311 also generates select signals Z2 that are provided to select inputs of selector circuit 313. Selector circuit 313 provides the encoded data indicated by data signals E5-E8 to a data signal D4, D5, or D6. The values of signals Z2 determine whether selector circuit 313 provides the encoded data indicated by data signals E5-E8 to data signal D4, data signal D5, or data signal D6. The selected data signal D4, D5, or D6 may be a one bit or multi-bit signal.

Control signals DCCS are provided to control inputs of FEC decoder circuits 331-333. Control signals DCCS determine which one of the three FEC decoder circuits 331-333 is enabled to decode the encoded data. Only one of the three FEC decoder circuits 331-333 is enabled at any one time based on the values of signals DCCS to decode the encoded data received from selector circuit 313 using the respective first, second, or third FEC code. In an embodiment, controller circuit 311 enables a FEC decoder circuit 331-333 that uses the same FEC code as the currently enabled FEC encoder circuit 321-323. The enabled FEC decoder circuit 331, 332, or 333 decodes the encoded data received in the respective data signal D4, D5, or D6. Controller circuit 311 generates values for signals DCCS and Z2 that cause selector circuit 313 to provide the encoded data from signals E5-E8 to the enabled FEC decoder circuit 331, 332, or 333 in the respective data signal D4, D5, or D6.

In response to a change in the line quality of signals L1-L4 as indicated by signals LQC, controller circuit 311 may adjust the values of signals ENCS and DCCS to cause FEC encoder circuits 321-323 and FEC decoder circuits 331-333 to generate the encoded data and the decoded data, respectively, using a different FEC code in order to generate desired line quality and channel characteristics for signals L1-L4. As an example, if FEC encoder circuit 321 and FEC decoder circuit 331 use a first weaker FEC code, and FEC encoder circuit 322 and FEC decoder circuit 332 use a second stronger FEC code, then controller circuit 311 may disable circuits 321 and 331 and enable circuits 322 and 332 in response to an increase in the BER of signals L1-L4 as indicated by signals LQC to reduce the BER to a desired value or range. Controller circuit 311 also adjusts signals Z1-Z2 in response to a change in the line quality of signals L1-L4 as indicated by signals LQC to cause selector circuits 312 and 313 to provide the encoded data from/to the newly enabled encoder and decoder, respectively.

FIG. 4 illustrates a fourth example of an optical/electrical system 401, according to an embodiment of the present invention. Optical/electrical system 401 of FIG. 4 includes PIC die 102 and electrical integrated circuit (EIC) die 403. System 401 may, for example, include a package that houses both PIC die 102 and EIC die 403. EIC die 403 includes electrical transmitter circuits 109A-109D, electrical receiver circuits 110A-110D, controller circuit 411, electrical transmitter circuits 451-452 and 461-462, electrical receiver circuits 453-454 and 463-464, and interface circuits 430 and 440. EIC die 403 includes other circuits that are not shown in FIG. 4 to simplify the drawing. For example, EIC die 403 may also have additional interface circuits that are similar to interface circuits 430 and 440. These interface circuits 430, 440, etc. may communicate with circuits 109A-109D and circuits 110A-110D.

Interface circuit 430 includes physical medium attachment (PMA) sublayer circuitry 431, FEC encoding circuit 432, FEC decoding circuit 433, and physical coding sublayer (PCS) circuitry 434. Interface circuit 440 includes physical medium attachment (PMA) sublayer circuitry 441, FEC encoding circuit 442, FEC decoding circuit 443, and physical coding sublayer (PCS) circuitry 444. PMA sublayer circuitry 431 and 441 perform the functions required by the physical medium attachment (PMA) sublayer of the physical layer of an Ethernet networking standard. PCS circuitry 434 and 444 perform the functions required by the physical coding sublayer (PCS) of the physical layer of an Ethernet networking standard. Transmitter circuits 109A-109D and receiver circuits 110A-110D function as described herein with respect to EIC die 103 or EIC die 303. In some embodiments, EIC die 403 includes the circuitry for encoding signals E1-E4 and decoding signals E5-E8 that is disclosed herein with respect to EIC die 103 of FIG. 1 or with respect to EIC die 303 of FIG. 3.

Parallel data signals A1 are provided to PCS circuitry 434 from circuitry in EIC die 403 that is not shown in FIG. 4. In an embodiment, parallel data signals A1 are generated based on a subset of the encoded data indicated by signals E5-E8. PCS circuitry 434 performs PCS functions on the data or encoded data indicated by signals A1 to generate encoded data in parallel data signals A2. Encoding circuit 432 encodes the encoded data indicated by signals A2 using a FEC code to generate encoded data indicated by parallel signals A3. PMA circuitry 431 performs PMA sublayer functions on the encoded data indicated by signals A3 to generate the encoded data in serial signals A4-A5. Transmitter circuits 451-452 generate serial data signals A6-A7 based on data signals A4-A5, respectively. Data signals A6-A7 are transmitted outside EIC die 403. Data signals A6-A7 indicate the same encoded data that is indicated by signals A4-A5, respectively.

Serial data signals B1-B2 are transmitted from outside EIC die 403 to receiver circuits 453-454, respectively. Receiver circuits 453-454 generate data signals B3-B4 based on data signals B1-B2, respectively. Data signals B3-B4 indicate the same encoded data that is indicated by signals B1-B2, respectively. PMA circuitry 431 performs PMA sublayer functions on the encoded data indicated by signals B3-B4 to generate the encoded data in parallel data signals B5. Decoding circuit 433 decodes the encoded data indicated by data signals B5 using the same FEC code used by encoding circuit 432 to generate decoded data in parallel data signals B6. PCS circuitry 434 performs PCS functions on the decoded data indicated by data signals B6 to generate decoded data in parallel data signals B7. Data signals B7 are provided to circuitry in EIC die 403 that is not shown in FIG. 4. In an embodiment, one or more of signals E1-E4 are generated based on the data indicated by data signals B7.

PCS circuitry 444, encoding circuit 442, PMA circuitry 441, and transmitter circuits 461-462 perform the same functions on the data indicated by parallel data signals C1 to generate data signals C2-C7 that are performed by interface circuit 430 on data signals A1-A7 as described herein. Serial data signals C6-C7 are transmitted outside EIC die 403. In an embodiment, parallel data signals C1 are generated based on a subset of the data or encoded data indicated by signals E5-E8.

Serial data signals D1-D2 are transmitted from outside EIC die 403 to receiver circuits 463-464, respectively. Receiver circuits 463-464, PMA circuitry 441, decoding circuit 443, and PCS circuitry 444 perform the same functions on the data indicated by serial signals D1-D2 to generate data signals D3-D7 that are performed by interface circuit 430 on data signals B1-B7 as described herein. In an embodiment, one or more of signals E1-E4 are generated based on the data indicated by data signals D7.

In some embodiments, PIC die 102 exchanges data with one or more external devices through an optical network using a different data communication protocol than the data communication protocol used by interface circuits 430 and 440 to exchange data with one or more external devices. In an exemplary embodiment, data is exchanged between PIC die 102 and one or more external devices through an optical network using an Ethernet standard at a rate of 400 Gigabits per second, and interface circuits 430 and 440 exchange data with one or more external devices through electrical Ethernet standard buses at a rate of 100 Gigabits per second. In this example, each of the circuits 451-454 and 461-464 transfers data to or from EIC die 403 at a data rate of 25 Gigabits per second.

Controller circuit 411 generates encoding and decoding control signals EDCX based on the line quality control signals LQC generated by line quality monitor circuit 104. One or more of control signals EDCX are provided to each of encoding circuit 432, decoding circuit 433, encoding circuit 442, and decoding circuit 443. Encoding circuit 432 and decoding circuit 433 select a FEC code for encoding and decoding the data indicated by data signals A2 and B5, respectively, based on the values of a first subset of control signals EDCX. Encoding circuit 442 and decoding circuit 443 select a FEC code for encoding and decoding the data indicated by data signals C2 and D5, respectively, based on the values of a second subset of control signals EDCX. Controller circuit 411 changes the FEC code used by circuits 432 and 433 and/or the FEC code used by circuits 442 and 443 by adjusting the respective first and second subsets of signals EDCX based on changes in the line quality of signals L1-L4 as indicated by changes in signals LQC.

In an alternative embodiment, PIC die 102 in system 401 is replaced with PIC die 202 that has the embedded FEC encoding and decoding circuits. In some instances, the forward error correction (FEC) provided by encoding circuit 112 and decoding circuit 113 and by encoding circuits 220A-220D and decoding circuits 221A-221D may not be enough FEC capability to achieve a desired bit error rate performance in system 401. In an embodiment, interface circuit 430 includes a KP4 Reed-Solomon (RS) FEC code that is designed to be split apart into two KR4 FEC codes. As an example, encoding circuit 432 may be divided into two separate encoding circuits, such that each of the two encoding circuits performs error correction encoding on a different portion of the encoded data indicated by signals A2.

In another embodiment, encoding circuit 432 and decoding circuit 433 may perform FEC encoding and decoding using a single KR4 FEC code. Alternately, a KP4 FEC code can be split into two smaller FEC codes that have the same parity ratio, i.e., from RS(544, 514) to two times (2×) RS(272, 257). This technique is disclosed in commonly-assigned U.S. Pat. No. 8,977,938, which is incorporated by reference herein in its entirety. If the KP4 FEC code is split into two KR4 FEC codes, for example, then one KR4 FEC code can be used by electrical interface circuit 430, and the other KR4 FEC code can be used by PIC die 202, in the embodiment in which PIC die 102 is replaced by PIC die 202 in system 401.

Figure 5:
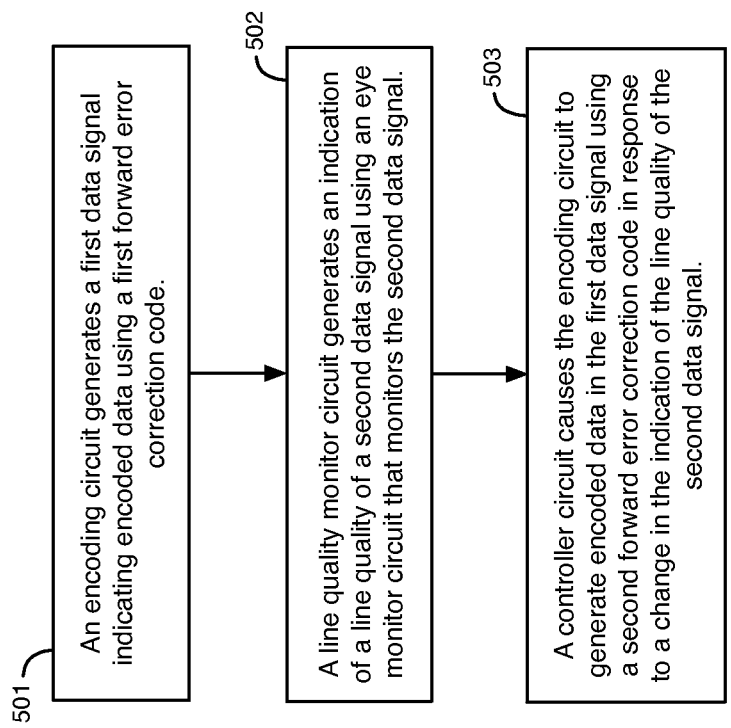
FIG. 5 is a flow chart that illustrates operations associated with changing a forward error correction (FEC) code used by an encoding circuit to generate encoded data, according to an embodiment of the present invention.

FIG. 5 is a flow chart that illustrates operations associated with changing a forward error correction (FEC) code used by an encoding circuit to generate encoded data, according to an embodiment of the present invention. In operation 501, an encoding circuit generates a first data signal indicating encoded data using a first forward error correction code. In operation 502, a line quality monitor circuit generates an indication of a line quality of a second data signal using an eye monitor circuit that monitors the second data signal. In operation 503, a controller circuit causes the encoding circuit to generate encoded data in the first data signal using a second forward error correction code in response to a change in the indication of the line quality of the second data signal.

Although methods of operations are described herein in a specific order, it should be understood that other operations may be performed in between described operations, described operations may be adjusted so that they occur at different times, or described operations may be distributed in a system that allows occurrence of the processing operations at various intervals associated with the processing.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A system comprising:
   an electronic integrated circuit die comprising:
      an encoding circuit to generate a first data signal indicating encoded data using a first forward error correction code,
      a controller circuit, and
      a decoding circuit; and
   a photonic integrated circuit die comprising:
      a line quality monitor circuit to generate an indication of a line quality of a second data signal using an eye monitor circuit that monitors the second data signal,
      an optical transmitter that transmits the encoded data indicated by the first data signal, and
      an optical receiver that generates a third data signal that is used to generate the second data signal,
   wherein the controller circuit causes the encoding circuit to generate encoded data in the first data signal using a second forward error correction code in response to a change in the indication of the line quality of the second data signal, and wherein the decoding circuit generates a fourth data signal indicating decoded data based on encoded data received from the optical receiver in the photonic integrated circuit die.

2. The system of claim 1,
   wherein the decoding circuit generates the fourth data signal indicating decoded data using the first forward error correction code,
   wherein the controller circuit causes the decoding circuit to generate decoded data in the fourth data signal using the second forward error correction code in response to the change in the indication of the line quality of the second data signal, wherein the fourth data signal is generated based on the third data signal, and wherein the first and second forward error correction codes are different codes.

3. The system of claim 1, wherein the eye monitor circuit generates a figure of merit for the second data signal that includes a jitter of the second data signal using an eye oscilloscope, and wherein the line quality monitor circuit generates the indication of the line quality of the second data signal based on the figure of merit for the second data signal.

4. The system of claim 1, wherein the indication of the line quality of the second data signal comprises a bit error rate, wherein the controller circuit causes the encoding circuit to generate encoded data in the first data signal using the second forward error correction code in response to the bit error rate of the second data signal increasing above a threshold, and wherein the controller circuit causes the encoding circuit to generate encoded data in the first data signal using the first forward error correction code in response to the bit error rate of the second data signal decreasing below a threshold.

5. The system of claim 1,
   wherein the photonic integrated circuit die further comprises an additional encoding circuit to encode the encoded data indicated by the first data signal and an additional decoding circuit to decode encoded data indicated by the third data signal, wherein the controller circuit causes the additional encoding circuit to generate encoded data in a fifth data signal using a different forward error correction code in response to a change in the indication of the line quality of the second data signal, and wherein the controller circuit causes the additional decoding circuit to generate decoded data in a sixth data signal using a different forward error correction code in response to a change in the indication of the line quality of the second data signal.

6. The system of claim 5, wherein the decoding circuit generates the fourth data signal based on the sixth data signal, and wherein the optical transmitter transmits the encoded data indicated by the fifth data signal.

7. The system of claim 1, wherein the photonic integrated circuit die further comprises an additional encoding circuit to encode encoded data indicated by the first data signal using a third forward error correction code, and wherein the photonic integrated circuit die further comprises an additional decoding circuit to decode encoded data using the third forward error correction code.

8. The system of claim 1 further comprising:
   a transmitter circuit, wherein the encoding circuit comprises a first component encoder to encode data using the first forward error correction code and a second component encoder to encode data using the second forward error correction code, and wherein the controller circuit enables one of the first or second component encoder as an enabled component encoder to generate encoded data based on input data; and
   a first selector circuit to provide encoded data generated by the enabled component encoder to the transmitter circuit, wherein the controller circuit enables a different one of the first or second component encoder in response to the change in the indication of the line quality of the second data signal.

9. The system of claim 8 further comprising:
   a receiver circuit;
   a second selector circuit; and
   wherein the decoding circuit comprises a first component decoder to decode encoded data using the first forward error correction code and a second component decoder to decode encoded data using the second forward error correction code, wherein the controller circuit enables one of the first or second component decoder as an enabled component decoder to generate decoded data based on encoded data received from the receiver circuit, and wherein the second selector circuit provides encoded data from the receiver circuit to the enabled component decoder.

10. The system of claim 2, wherein the controller circuit comprises a counter circuit that determines a bit error rate based on error information received from the decoding circuit to verify that a desired bit error rate has been achieved in the second data signal.

11. A system comprising:
a photonic integrated circuit die that comprises a line quality monitor circuit; and
an electronic integrated circuit die that comprises:
an encoding circuit to generate a first data signal indicating encoded data;
a decoding circuit to generate a second data signal indicating decoded data, wherein the line quality monitor circuit generates an indication of a line quality of a third data signal using an eye monitor circuit;
a controller circuit to cause at least one of the encoding circuit to generate encoded data in the first data signal or the decoding circuit to generate decoded data in the second data signal using a different forward error correction code in response to a change in the indication of the line quality of the third data signal; and
an interface circuit, wherein the interface circuit processes data for exchange with an external device outside the electronic integrated circuit die, wherein the interface circuit comprises an additional encoding circuit and an additional decoding circuit, and wherein the controller circuit causes the additional encoding circuit to generate encoded data and the additional decoding circuit to generate decoded data using a different forward error correction code in response to a change in the indication of the line quality of the third data signal.

12. The system of claim 11, wherein the line quality monitor circuit generates the indication of the line quality of the third data signal based on jitter in the third data signal using an eye oscilloscope.

13. The system of claim 11, wherein the controller circuit causes the encoding circuit to generate encoded data in the first data signal using a different forward error correction code in response to a change in the indication of the line quality of the third data signal, and wherein the controller circuit causes the decoding circuit to generate decoded data in the second data signal using a different forward error correction code in response to a change in the indication of the line quality of the third data signal.

14. The system of claim 11, wherein the electronic integrated circuit die further comprises a first transmitter circuit to transmit encoded data indicated by the first data signal to the photonic integrated circuit die, wherein the electronic integrated circuit die further comprises a first receiver circuit to receive encoded data from the photonic integrated circuit die and to generate a fourth data signal that is provided to the decoding circuit, and wherein the decoding circuit generates the second data signal based on the fourth data signal.

15. The system of claim 14, wherein the electronic integrated circuit die further comprises a second transmitter circuit to transmit encoded data to the external device and a second receiver circuit to receive encoded data from the external device, wherein the interface circuit provides encoded data to the second transmitter circuit and receives encoded data from the second receiver circuit, wherein the interface circuit further comprises physical medium attachment (PMA) sublayer circuitry that performs PMA functions on encoded data received from and transmitted to the external device, and wherein the interface circuit further comprises physical coding sublayer (PCS) circuitry that performs PCS functions on data provided to the additional encoding circuit and on data received from the additional decoding circuit.

16. The system of claim 11, wherein the photonic integrated circuit die further comprises optical transmitters, optical receivers, a third encoding circuit to generate encoded data, and a third decoding circuit to generate decoded data, and wherein the controller circuit causes the third encoding circuit to generate encoded data and the third decoding circuit to generate decoded data using a different forward error correction code in response to a change in the indication of the line quality of the third data signal.

17. A method comprising:
generating a first data signal indicating encoded data with a first forward error correction code in an encoding circuit in an electronic integrated circuit die;
generating an indication of a line quality of a second data signal using an eye monitor circuit that monitors the second data signal in a photonic integrated circuit die;
causing the encoding circuit to generate encoded data in the first data signal with a second forward error correction code using a controller circuit in the electronic integrated circuit die in response to a change in the indication of the line quality of the second data signal;
transmitting the encoded data indicated by the first data signal using an optical transmitter in the photonic integrated circuit die; and
generating a third data signal indicating decoded data using a decoding circuit in the electronic integrated circuit die by decoding encoded data received from an optical receiver in the photonic integrated circuit die.

18. The method of claim 17, further comprising:
causing the decoding circuit to generate decoded data in the third data signal with a different forward error correction code using the controller circuit in response to the change in the indication of the line quality of the second data signal.

19. The method of claim 17, wherein generating an indication of a line quality of a second data signal using an eye monitor circuit that monitors the second data signal further comprises generating a figure of merit for the second data signal that includes at least one of a random jitter, a deterministic jitter, or a bounded uncorrelated jitter of the second data signal using an eye oscilloscope in the eye monitor circuit, and wherein a line quality monitor circuit generates the indication of the line quality of the second data signal based on the figure of merit for the second data signal.

20. The method of claim 17, wherein generating an indication of a line quality of a second data signal using an eye monitor circuit that monitors the second data signal further comprises generating a bit error rate of the second data signal,
wherein causing the encoding circuit to generate encoded data in the first data signal with a second forward error correction code further comprises causing the encoding circuit to generate encoded data in the first data signal using the second forward error correction code in response to the bit error rate of the second data signal increasing above a threshold, and wherein the method further comprises causing the encoding circuit to generate encoded data in the first data signal using the first forward error correction code in response to the bit error rate of the second data signal decreasing below the threshold.

\* \* \* \* \*